April 28, 1970 R. W. ARNOLD ET AL 3,509,474
ABSOLUTE VALUE FUNCTION GENERATOR
Filed Nov. 9, 1967
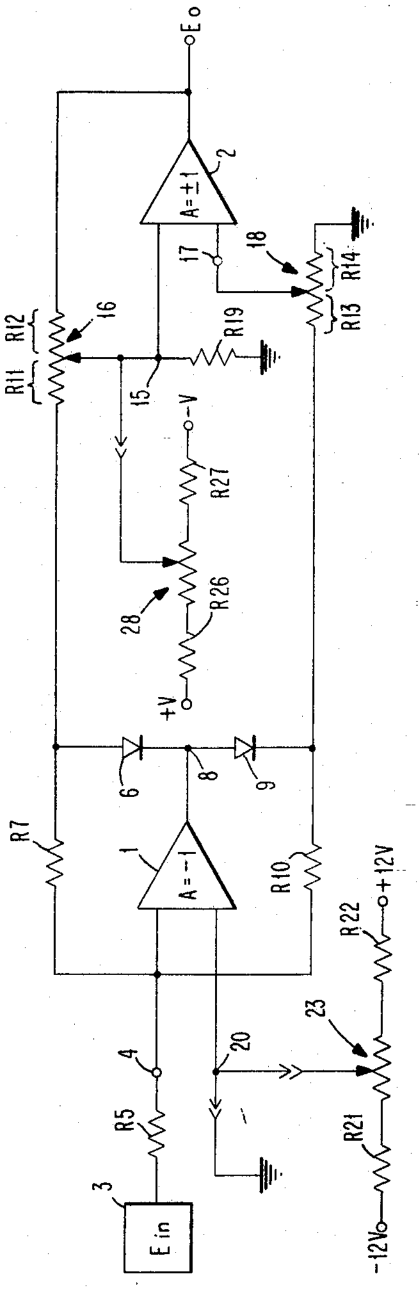
INVENTORS
ROBERT W. ARNOLD
JAMES C. GREESON, JR.
BY John C Black
ATTORNEY

United States Patent Office 3,509,474

Patented Apr. 28, 1970

3,509,474

ABSOLUTE VALUE FUNCTION GENERATOR

Robert W. Arnold, Endicott, and James C. Greeson, Jr., Woodstock, N.Y., assignors to International Business Machines Corporation, Armonk, N.Y., a corporation of New York Filed Nov. 9, 1967, Ser. No. 681,631

Int. Cl. H03k *5/20*

U.S. Cl. 328—118 8 Claims

ABSTRACT OF THE DISCLOSURE

Bipolar signals are applied to one input of a first operational amplifier of the differential amplifying type. The negative feedback loop of the amplifier includes two paths having oppositely poled diodes and feedback resistors. The positive and negative voltages obtained at the diode-resistor junctions are applied respectively to non-inverting and inverting inputs of a second operational amplifier to produce at the output of the latter amplifier an absolute value signal corresponding to the bipolar input signal. The input resistances to the second operational amplifier and its negative feedback resistance are adjusted so that the gain of the second amplifier is plus one (e.g. unity) when the input is positive and is minus one when the input is negative.

CROSS REFERENCES TO RELATED APPLICATIONS

A copending application Ser. No. 652,796 of W. G. Crouse et al. filed July 12, 1967, and entitled "Absolute Value Function Generator" discloses an economical device with significantly improved performance; however, the improved circuit of the present application exhibits an even higher degree of linearity, frequency response and accuracy.

BACKGROUND OF THE INVENTION

Field of the invention

In many areas of process control, analog computers and hybrid digital-analog fields such as character recognition, the need frequently arises for absolute value function generators. As the performance in these applications becomes more stringent, the need for significantly greater linearity, frequency response, and accuracy becomes critical. It is to these more advanced areas of the art that the improved circuit of the present application is directed.

Description of the prior art

In addition to the above-mentioned copending application, many approaches to generating absolute value signals have been implemented, most of which are characterized alternatively by means for summing signals of opposite polarity to achieve the absolute value signal or by means including oppositely poled diodes for coupling signals of one polarity to an operational amplifier with a gain of plus one and signals of the opposite polarity to a second operational amplifier having a gain of minus one. The latter known approaches are known to be very poor with respect to linearity, accuracy and/or frequency response.

SUMMARY OF THE INVENTION

It is therefore a primary object of the present invention to provide an absolute value function generator which is characterized by a very high degree of accuracy and linearity and a very high frequency response.

This object is achieved in a preferred embodiment of the invention by applying the bipolar input signals to a first operational amplifier having a closed loop gain of minus one. The negative feedback loop includes a first path including a series-connected diode and feedback resistor and a second path including an oppositely poled diode and feedback resistor. One electrode of each diode is connected directly to the output terminal of the amplifier and the opposite electrodes of the diodes are connected to the inverting and non-inverting inputs of a second operational amplifier having a closed loop gain of plus one or minus one, depending upon which of the two diodes is conducting.

It would be desirable to couple the output of the first amplifier directly into one or the other input to the second amplifier depending upon the polarity of the first amplifier output, for example through theoretically zero impedance devices which are polarity sensitive.

However, in a practical environment, the first amplifier output must be coupled through discrete devices, that is, the diodes which have voltage drops when conducting. Thus the diodes introduce D-C errors with respect to ground in the output of the first amplifier. The magnitude of these errors, however, is substantially equal to the voltage drop across the conducting diode divided by the D-C open loop gain of the first amplifier. By selecting an amplifier which has a very high D-C open loop gain, for example fifty thousand to infinity, the D-C errors introduced by the diodes can be maintained at a very low or insignificant value.

In addition, when a high degree of accuracy is required, a first operational amplifier is selected which has an inherent D-C offset error equal substantially to zero or alternatively a means is provided for adjusting the D-C offset error to zero.

In the preferred embodiment, the two diodes have closely matched voltage-current characteristics. The D-C offset error appearing at the output of the second operational amplifier will be substantially equal to any voltage difference due to mis-match of the two diodes divided by the D-C open loop gain of the first operational amplifier, assuming that the inherent D-C offset error of the second amplifier is equal to zero. Slight offset errors caused by any mis-match in the diodes and by an inherent D-C offset in the second amplifier can be compensated for by a voltage adjustment in one input of the second amplifier. The gain bandwidth characteristics of the second operational amplifier should be as good as those of the first operational amplifier; and, in a typical environment, the amplifiers will be substantially identical to each other, e.g. open loop gain equal to fifty thousand and ten megacycle frequency response.

The foregoing and other objects, features and advantages of the invention will be apparent from the following more particular description of a preferred embodiment of the invention, as illustrated in the accompanying drawing.

BRIEF DESCRIPTION OF THE DRAWING

The single figure illustrates a preferred form of the improved circuit partially schematic and partially diagrammatic.

DESCRIPTION OF THE PREFERRED EMBODIMENT

The improved function generator includes amplifiers 1 and 2. Bipolar signals from a source 3 are coupled to the inverting input terminal 4 of the amplifier 1 by way of a resistor R5. The amplifiers are preferably of the type sometimes referred to as "operational amplifiers" characterized by high input impedance, high open loop gain, zero offset voltage, and high frequency response.

A first negative feedback path includes a diode 6 and a resistor R7 coupled between the amplifier output terminal 8 and the input terminal 4. A second negative feedback path includes a diode 9 and a resistor R10 coupled between the terminals 8 and 4.

The junction between the resistor R7 and the diode 6 is coupled to an inverting input terminal 15 of the amplifier 2 by way of a portion R11 of a potentiometer 16, the other portion R12 of the potentiometer forming the negative feedback resistance of the amplifier 2.

The junction between the diode 9 and the resistor R10 is coupled to a non-inverting input terminal 17 of the amplifier 2 by way of a portion R13 of a potentiometer 18, the other portion R14 of which is connected to ground potential.

The potentiometers 16 and 18 are used for adjusting the gain of the amplifier 2 to minus and plus one (unity) for positive and negative input signals at the terminal 4 respecively. A resistor R19 is coupled between the terminal 15 and ground to provide a feedback resistor to series input resistor ratio of unity in the gain equation for input signals of negative polarity at the terminal 4. With potentiometer 16 properly set, $E_o$ absolute will equal $E_{in}$ absolute for positive input signals; and with potentiometer 18 properly set, $E_o$ absolute will equal $E_{in}$ absolute for negative input signals. It will be appreciated that in some applications, carefully selected sets of precision resistors of the proper dimensions can be used in place of the potentiometers 16 and 18; however, some error is introduced by the resistor tolerances.

When $E_{in}$ is positive, only the diode 6 is forward biased; and the signal is inverted by both amplifiers to produce a positive output $E_o$. When $E_{in}$ is negative, only the diode 9 is forward biased; and the signal is inverted by the amplifier 1 to produce a positive output $E_o$.

The gain of the circuit for positive values of $E_{in}$ may be expressed as:

$$E_o=E_{in}\left(\frac{-R7}{R5}\right)\left(\frac{-R12}{-R11}\right)$$

and the gain of the circuit for negative values of $E_{in}$ may be expressed as:

$$E_o=-E_{in}\left(\frac{-R10}{R5}\right)\left(\frac{R14}{R13+R14}\right)\left(1+\frac{R12[R7+R11+R19]}{R19[R7+R11}\right)$$

it being assumed in both equations that the amplifier offset is zero and any offset error due to the diodes 6 and 9 being so low as to be neglected.

In the event that the amplifier 1 is free of offset errors, the non-inverting input terminal 20 is grounded. However, if an amplifier is selected which has inherent offset error, the terminal 20 is preferably connected to an offset correction circuit including resistors R21 and R22 and a potentiometer 23. The wiper of the potentiometer is adjusted for zero offset voltage at the amplifier output for zero input levels.

A similar offset correction circuit including resistors R26, R27 and potentiometer 28 can be connected to the input terminal 15 when desired to compensate for and correct inherent offset error in the amplifier 2.

One suitable set of resistance values for the circuit illustrated is set forth below by way of example; however, it will be appreciated that other sets of resistance values can be used:

| Resistors: | Value in ohms |
|---|---|
| R5, R7, R10 | 10,000 |
| R11, R12, R13, R14 | 1,000 |
| R19 | 1,100 |
| R21, R22 | 1,000 |
| R26, R27 | 100,000 |
| 23 (potentiometer) | 200 |
| 28 (potentiometer) | 2,000 |

It will be appreciated that a negative polarity output voltage $E_o$ can be obtained merely by reverseing the polarity of the diodes 6 and 9.

In addition, the input signal $E_{in}$ can be coupled to the non-inverting input terminal 20 if desired. In this instance, R5 is removed and care must be taken to select an amplifier with very high input impedance to obtain a gain of unity.

While the invention has been particularly shown and described with reference to a preferred embodiment thereof, it will be understood by those skilled in the art that the foregoing and other changes in form and details may be made therein without departing from the spirit and scope of the invention.

We claim:

1. An absolute value function generator comprising
first and second amplifiers, each having inverting and non-inverting input terminals and an output terminal,
one of the input terminals of the first amplifier being adapted to receive bipolar signals,
oppositely poled diodes each coupling output signals of a respective polarity from the first amplifier to a respective one of the input terminals of the second amplifier to produce at the output terminal of the second amplifier signals of one selected polarity only,
a negative feedback circuit for each amplifier,
the negative feedback circuit of the first amplifier having a pair of parallel paths, each path including a respective one of the diodes, and
means including the feedback circuits establishing a closed loop gain of unity from said one input terminal of the first amplifier to the output terminal of the second amplifier.

2. An absolute value function generator comprising
first and second amplifiers, each having inverting and non-inverting input terminals and an output terminal and each having unity gain for signals applied to those input terminals adapted to receive signals,
one of the input terminals of the first amplifier being adapted to receive bipolar signals,
oppositely poled diodes each coupling output signals of a respective polarity from the first amplifier to a respective one of the input terminals of the second amplifier to produce at the output terminal of the second amplifier signals of one selected polarity only, and
the first amplifier including a negative feedback circuit having a pair of parallel paths, each path including a respective one of the diodes.

3. The function generator of claim 2 wherein each amplifier is characterized by high input impedance, high open loop gain, zero offset voltage and high frequency response.

4. The function generator of claim 3 wherein each path of the negative feedback circuit comprises.
one of said diodes and a respective precision resistor connected in series between the output and inverting input terminals of the first amplifier.

5. The function generator of claim 3 wherein the inverting input terminal of the first amplifier is adapted to receive the bipolar signals.

6. The function generator of claim 2
wherein the diodes have matched voltage-current characteristics, and
wherein means are provided for setting the offset errors of the amplifiers to zero.

7. An absolute value function generator comprising
first and second amplifiers of the differential amplifying type, each having an output terminal and inverting and non-inverting input terminals,
one of the input terminals of the first amplifier being adapted to receive signals from a bipolar signal source,
a negative feedback circuit coupled between the inverting input terminal and the output terminal of the first amplifier and including two parallel paths, each path including a series-connected resistor coupled to the inverting input terminal and diode coupled to the output terminal, the diodes being oppositely poled, means setting the closed loop gain of the first amplifier to unity, means connecting the junction between each series-connected resistor and diode to a respective one of the input terminals of the second amplifier to couple negative and positive polarity signals to different ones of the latter input terminals, means including a negative feedback circuit setting the closed loop gain of the second amplifier to plus and minus unity for signals applied to the non-inverting and inverting input terminals respectively.

8. The function generator of claim 7 wherein each amplifier is characterized by high input impedance, high open loop gain and high frequency response, wherein the diodes have matched voltage-current characteristics, said generator further including means setting the offset errors of the amplifiers to zero.

References Cited

UNITED STATES PATENTS

| | | | |
|---|---|---|---|
| 2,822,474 | 2/1958 | Boecker | 328—26 |
| 2,832,886 | 4/1958 | Morrill | 328—143 |
| 3,112,449 | 11/1963 | Miller | 328—26 |
| 3,330,973 | 7/1967 | Clapper | 307—262 |
| 3,426,186 | 2/1969 | Takemura | 235—197 |

JOHN S. HEYMAN, Primary Examiner

S. D. MILLER, Assistant Examiner

U.S. Cl. X.R.

235—197; 307—229, 236; 328—142

PO-1050
(5/69)

UNITED STATES PATENT OFFICE
CERTIFICATE OF CORRECTION

Patent No. 3,509,474 Dated April 28, 1970

Inventor(s) Robert W. Arnold et al

It is certified that error appears in the above-identified patent and that said Letters Patent are hereby corrected as shown below:

In the specification, Column 3, lines 33 and 34, that portion of the formula reading $\left(\frac{-R12}{-R11}\right)$ should read $\left(\frac{-R12}{R11}\right)$ Column 3, lines 41 and 42, that portion of the formula reading $\left(1 + \frac{R12\ [R7 + R11 + R19]}{R19\ [R7 + R11}\right)$ should read $\left(1 + \frac{R12\ [R7 + R11 + R19]}{R19\ [R7 + R11]}\right)$ Column 3, line 73, the word "reverseing" should read --reversing--.

In the claims, Claim 4, Column 4, line 52, delete the period "." after the word "comprises".

SIGNED AND SEALED

SEP 22 1970

(SEAL)
Attest:

Edward M. Fletcher, Jr.
Attesting Officer

WILLIAM E. SCHUYLER, JR.
Commissioner of Patents